US 6,573,727 B2

(12) United States Patent
Krahn et al.

(10) Patent No.: US 6,573,727 B2
(45) Date of Patent: Jun. 3, 2003

(54) METHOD AND APPARATUS FOR EVALUATION OF INSULATION IN VARIABLE SPEED MOTORS

(75) Inventors: John Raymond Krahn, Schenectady, NY (US); Thomas Paul Feist, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/681,141

(22) Filed: Jan. 25, 2001

(65) Prior Publication Data

US 2002/0097065 A1 Jul. 25, 2002

(51) Int. Cl.[7] .................... H01H 33/00; G01R 31/12
(52) U.S. Cl. .................... 324/536; 324/772; 318/490
(58) Field of Search ................... 324/772, 546, 324/545, 536, 72, 102, 726; 322/99; 318/490; 340/646, 647, 648; 702/58; 73/116

(56) References Cited

U.S. PATENT DOCUMENTS

| 4,156,846 A | * | 5/1979 | Harold et al. ............... 324/772 |
| 4,446,426 A | * | 5/1984 | Emery et al. ............... 324/772 |
| 4,800,334 A | * | 1/1989 | Berney ....................... 324/772 |
| 5,461,329 A | * | 10/1995 | Linehan et al. ............. 324/772 |
| 5,680,059 A | * | 10/1997 | Shiota et al. ............... 324/772 |
| 5,689,194 A | * | 11/1997 | Richards, II et al. ........ 324/722 |
| 5,831,538 A | * | 11/1998 | Schena ....................... 340/635 |

* cited by examiner

Primary Examiner—Kamand Cuneo
Assistant Examiner—Paresh Patel
(74) Attorney, Agent, or Firm—Patrick K. Patnode; Christian G. Cabou

(57) ABSTRACT

A signal obtained from the drive input of a motor or an insulated winding is applied to a sensor that strongly rejects high frequency drive signal components yet passes discharge signal components. This allows discharge signal components to be detected in the presence of harmonics of the drive signal. The voltage of the drive signal may be varied so that the lowest drive signal voltage producing a discharge event may be determined. That voltage is the motor or winding's corona inception voltage.

18 Claims, 8 Drawing Sheets

Peak Log 10dB/
Start 2.0 MHz, Stop 50.0 MHz
Res BW 300 KHz, VBW 100 kHz, SWP 20.0 msevc Peak Log 10dB/
Start 2.0 MHz, Stop 50.0 MHz
Res BW 300 KHz, VBW 100 kHz, SWP 20.0 msevc Peak Log 10dB/
Start 2.0 MHz, Stop 50.0 MHz
Res BW 300 KHz, VBW 100 kHz, SWP 20.0 msevc Peak Log 10dB/
Start 2.0 MHz, Stop 50.0 MHz
Res BW 300 KHz, VBW 100 kHz, SWP 20.0 msevc

METHOD AND APPARATUS FOR EVALUATION OF INSULATION IN VARIABLE SPEED MOTORS

BACKGROUND OF INVENTION

The invention pertains to variable speed motors, and particularly to on line evaluation of the health of insulation in a variable speed motor.

Reliability is critical to the operation of industrial systems in which motors are employed. According to several recent studies of industrial motors, nearly 40% of all motor failures occur as the result of damage to the electrical insulation in the motor winding. Damage or excessive electrical stress to insulation may ultimately lead to catastrophic failure of the motor winding.

Insulation health is closely related to electrical discharge activity within the electrical insulation system of the motor. Electrical discharges are generally produced by differences between the potential of adjacent windings, adjacent turns, or between a winding and a metallic component such as the stator core. Turn-to-turn electrical discharge is caused by the turn-to-turn electrical stress and exacerbated by the fast rise times of new drive technology. The resulting discharge, sometimes referred to as a partial discharge event or simply discharge event, is a current spike on the order of 10–100 micro Amps, and having a duration of approximately 10–100 ns. Due to the transfer function of the motor winding and the propagation path of the discharge signal to a sensor, the discharge signal may be corrupted. This results in a broad frequency spectrum for the discharge signals generally beginning in the range of 100 kHz and extending to approximately 200 MHz or more.

Insulation systems are generally classified into either corona-resistant or non-corona-resistant. Non-corona resistant insulation systems must operate without discharge activity or premature failure will occur. Corona-resistant systems may operate for long periods with electrical discharge before failure occurs. Unless specified otherwise, all references herein are to non-corona-resistant insulation systems.

The voltage at which discharge occurs is the corona inception voltage (CIV). The higher the CIV, the stronger the winding insulation, and therefore the longer the motor life. The discharge event corresponds to a process of insulator degradation. Degradation is a complex process involving a cascade of electrons at the discharge site. This cascade accelerates in the electric field and impacts one side of the discharge site. The electrons ionize and break down the material, preferentially attacking organic species (such as the polymeric binder of the insulation system). The ions then react with available species (such as oxygen, water, etc.) and form acids. These acids then further degrade the insulation system. Furthermore, the impact of the electrons on the surface also causes localized heating, resulting in thermal degradation. Thus, measuring and monitoring the electrical discharge activity, and particularly the corona inception voltage, provides a means of assessing the health of the machine and allows one to make an estimate of risk to continued use or expected life.

For purposes of the present disclosure, motors are divided into two categories based on the type of drive signal that they employ. A first type of motor, often referred to as a synchronous motor, is driven by a simple 50 or 60 Hz sine wave. This drive signal is relatively pure, and therefore has few harmonics. As a result, the frequency spectrum of the drive signal, including harmonics, is relatively confined, and does not overlap with the signals produced by discharge events, thus, the overlapping harmonics of the drive signal can be filtered out using a very simple capacitor filter.

The second type of motor, which will be referred to herein as a variable speed motor (also known as an inverter drive motor or an adjustable speed drive motor), is driven by a pulse generator that is controlled to produce a simulated sine wave consisting of a series of square pulses. In other words, the output waveform is composed of a series of discrete pulses that are selected in their amplitude and pulse width to effect a sinusoidal waveform. While such a drive waveform powers the motor in the effectively same manner as a true sine wave, the individual square wave pulses contribute harmonics that far exceed those of a synchronous drive signal in both amplitude and breadth of spectrum. The frequency spectrum of the drive signal may exceed 5 MHz and therefore largely overlaps the partial discharge event frequency spectrum. Furthermore, since under operating conditions the drive waveform is typically on the order of 100 kV and 100 A, the drive harmonics will exceed the discharge event signal by 50 dB or more. These harmonics would saturate the typical amplifier/detection circuits commonly used for discharge detection in prior art synchronous motor applications, thereby rendering it impossible to monitor the health of the insulation system while the motor is on line. Thus the prior art methods for detecting discharge in synchronous motors are ineffective when applied to variable speed motors.

SUMMARY OF INVENTION

Motors may be tested in one of two modes: (1) off-line and (2) on-line. Off-line testing involves injecting a representative fast-rise time pulse(s) into the winding either at regularly increasing voltage levels until discharge activity is detected, or at a predetermined voltage level wherein a measure of the total or peak discharges are measured. In off-line testing, the motor is not performing work. On-line testing involves merely detecting the presence of discharges while the motor is operated, performing work, using the drive. If a customized drive is available, allowing variable voltage control, then inception voltage may be determined.

Accordingly, embodiments of the invention enable detection of discharge events in variable speed motors under actual operating conditions, i.e. while being driven by a variable speed drive waveform of typical operating voltage and amplitude. Further embodiments of the invention is to provide a method and an apparatus for detecting signals produced by discharge events in the presence of harmonics of a variable speed drive signal, or a fast rise time waveform. Still further embodiments of the invention is to provide a method and an apparatus for detecting the corona inception voltage for a variable speed drive motor by monitoring for discharge activity in the presence of harmonics of the variable speed drive signal or a fast-rise time waveform.

Embodiments of the invention may apply a signal obtained from the drive input of a motor to a sensor that strongly rejects high frequency drive signal components yet passes discharge signal components. The sensor thus allows discharge signal components to be detected in the presence of harmonics of the variable speed drive signal. The aforesaid sensor may be applied while varying the voltage of the drive signal and determining the lowest drive signal voltage at which a discharge event is detected, thereby identifying the motor's corona inception voltage.

Further embodiments of the invention may determine discharge magnitude and duration relative to the input drive signal (phase-resolved analysis), and determine an electrical discharge trend that can be used to plan scheduled outage/maintenance or to provide an estimate of risk to continued operation, or that can be used for design quality assurance or manufacturing quality assurance and control.

DETAILED DESCRIPTION

Figure 1:
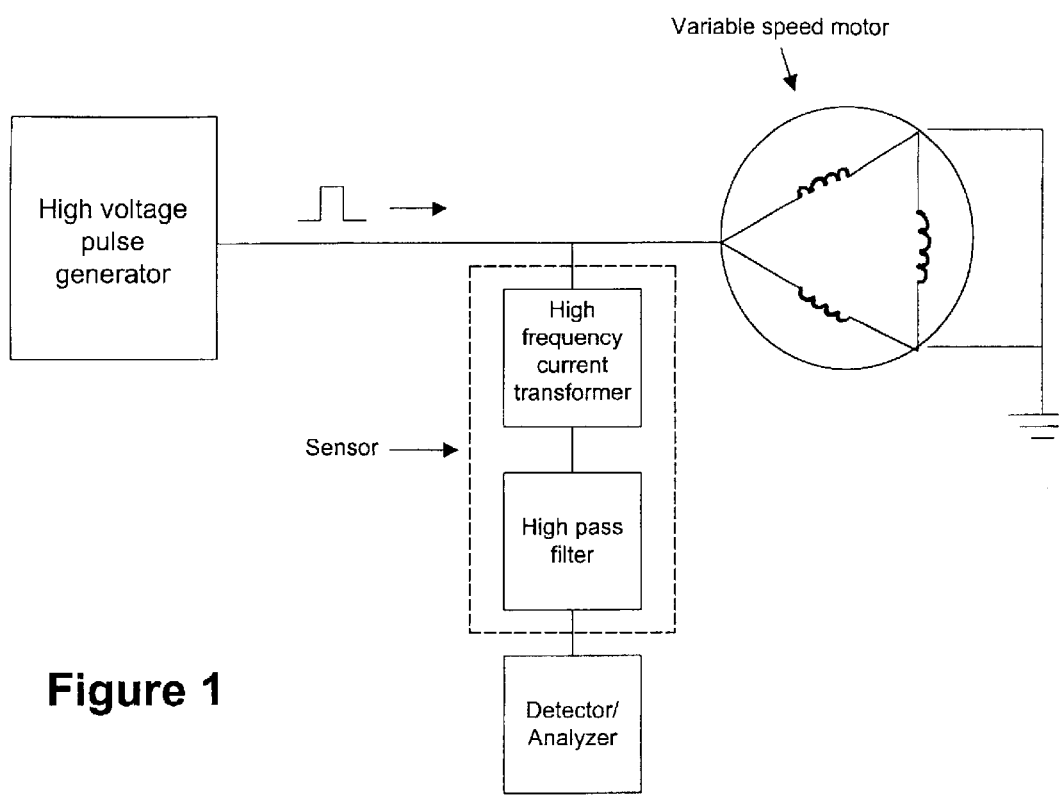
FIGS. 1 and 2 illustrate systems for off line and on line analysis of a variable speed motor, respectively.
Figure 2:
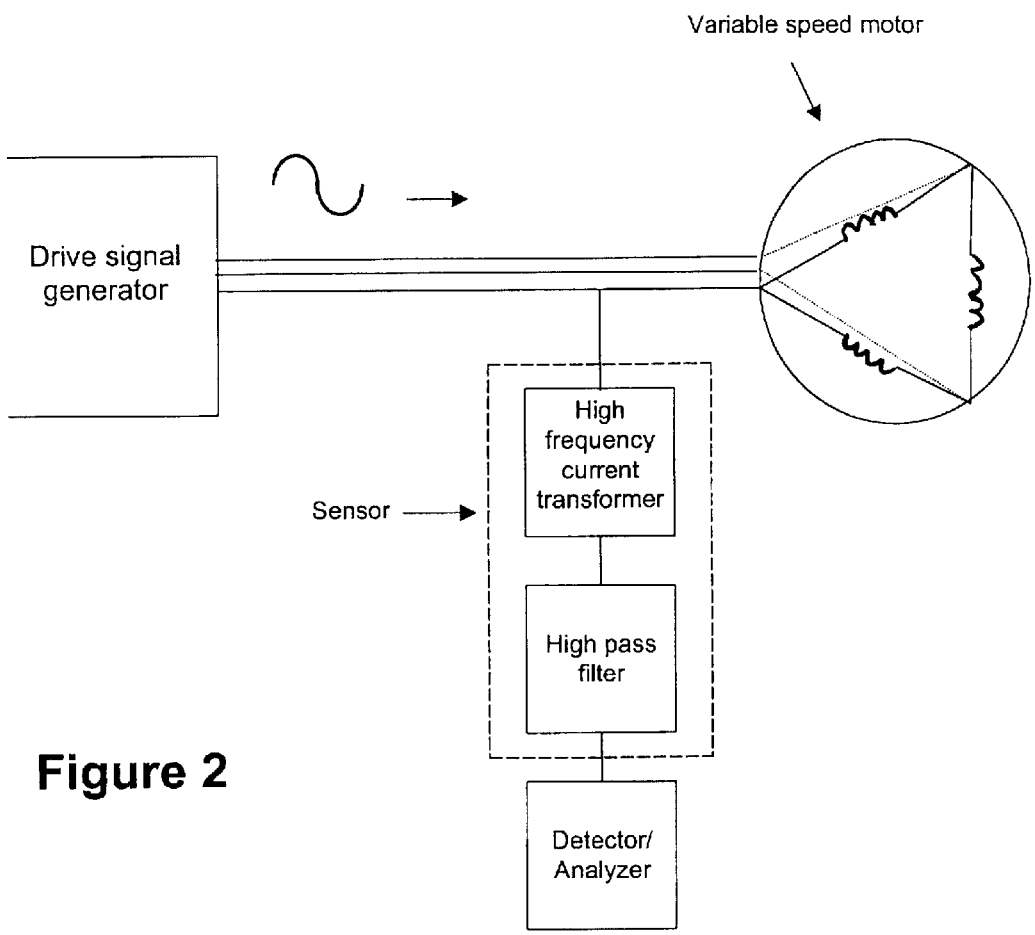

Systems for off line and on line testing are illustrated in FIGS. 1 and 2. In FIG. 1, the insulated windings of a variable speed motor are driven by the output of a high voltage pulse generator. While the illustrated windings are Delta-connected, the invention is equally applicable to Wye-connected windings. In FIG. 2, the windings are driven by a drive signal generator providing a three-phase sinusoidal drive signal. The sinusoidal signal may be provided as a series of square pulses that approximate a sinusoidal waveform. In either case, when the peak voltage of the signal applied to the windings exceeds the corona inception voltage of the windings, an electrical discharge will occur as described above.

In both systems, at the drive input of the motor, a signal S at the drive input is coupled by a high frequency current transformer. A high pass filter receives the signal coupled by the current transformer. The high pass filter preferably has eight or more poles. The high pass filter and the high frequency current transformer operate together as a circuit that will be referred to herein as a sensor. The transfer function of the sensor is chosen in consideration of the characteristics of the drive signal and a discharge event detection threshold, as discussed below.

The output of the sensor is received by a detector/analyzer unit. The detector/analyzer may be an oscilloscope or spectrum analyzer, or suitable recording devices such as a fast A/D converter. The function of the detector/analyzer is to produce an indication of a discharge based on detection of components in the output of the sensor that result from the discharge. The sensor and detector/analyzer thus comprise a system for evaluating insulation defects in a variable speed motor.

Figure 3:
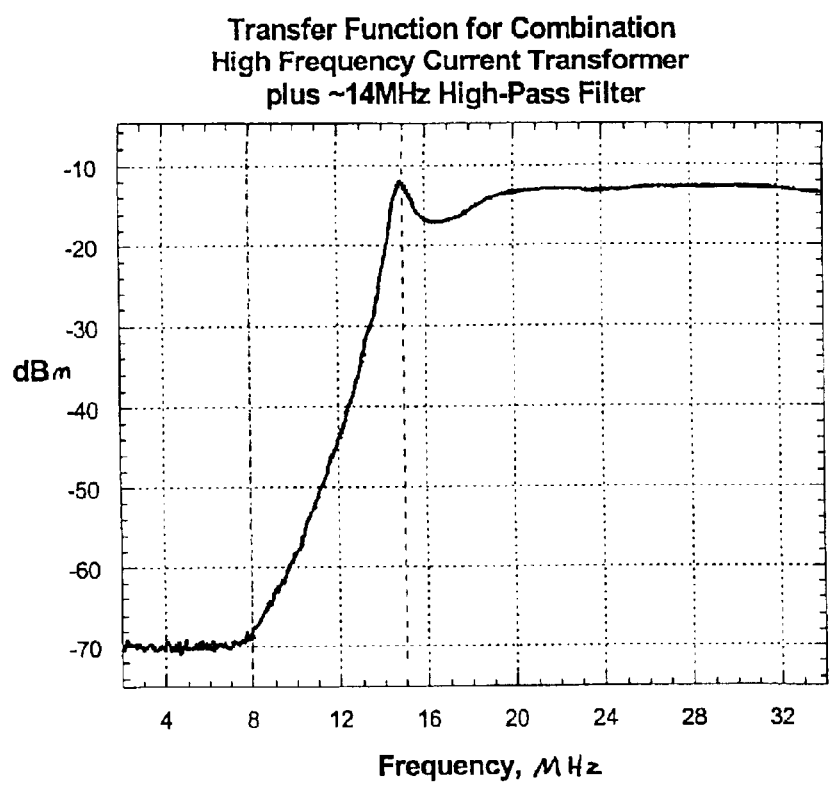
FIG. 3 illustrates the characteristics of an exemplary sensor for a system as illustrated in FIGS. 1 and 2.

The sensor is fully characterized by a cut-off frequency and a rejection. This is mapped by the transfer function shown in FIG. 3. As noted above, the magnitude of the drive waveform is typically on the order of 100 kV and 100 A, with a spectrum that may exceed 5 MHz. In contrast, a discharge signal has a magnitude on the order of 10–100 micro Amps, and a frequency spectrum generally beginning in the range of 100 kHz and extending up to approximately 200 MHz. Thus, not only does the drive signal spectrum overlap a significant portion of the discharge signal spectrum, but it does so by 50 dB or more. Accordingly, to permit detection of discharge signal components, the sensor must reject components at the high end of the drive signal frequency spectrum, while passing components of the discharge signal that lie outside the drive signal spectrum. In other words, the sensor has a transfer function characterized by a cutoff at a frequency within an overlap of the frequency spectrum of the drive signal and a frequency spectrum of a discharge event, and having a rejection for reducing components of said drive signal to below a predetermined detection threshold for a discharge event. An exemplary transfer function of such a sensor is shown in FIG. 3. As noted in FIG. 3, the transfer function pertains to a combination of a high frequency current transformer and high pass filter, as illustrated in FIGS. 1 and 2. The sensor has a cutoff frequency of 15 MHz and provides rejection of 70 dBm at approximately 8 MHz. This transfer function effectively allows passage of some discharge signal components while suppressing drive signal components in a band that overlaps the discharge signal components. In practice, it has been found that a sensor having a cutoff in the range of approximately 5 MHz to 20 MHz, and a rejection of 60 dB within one decade of the cutoff frequency provides an acceptable output signal. The sensor employed should have the sharp cut-off frequency shown in FIG. for optimal performance. Lesser cut-off capability may also work, but makes the final data analysis more difficult and sometimes less sensitive.

Alternatively, one may tune the drive waveform to lessen the high-frequency components that overlap the discharge signals, thereby opening up a larger viewing window, enabling easier or more sensitive detection. In practice, this is often difficult because most commercial drives have a non-user-adjustable waveform output that is pre-set by hardware and firmware algorithms.

Figure 4:
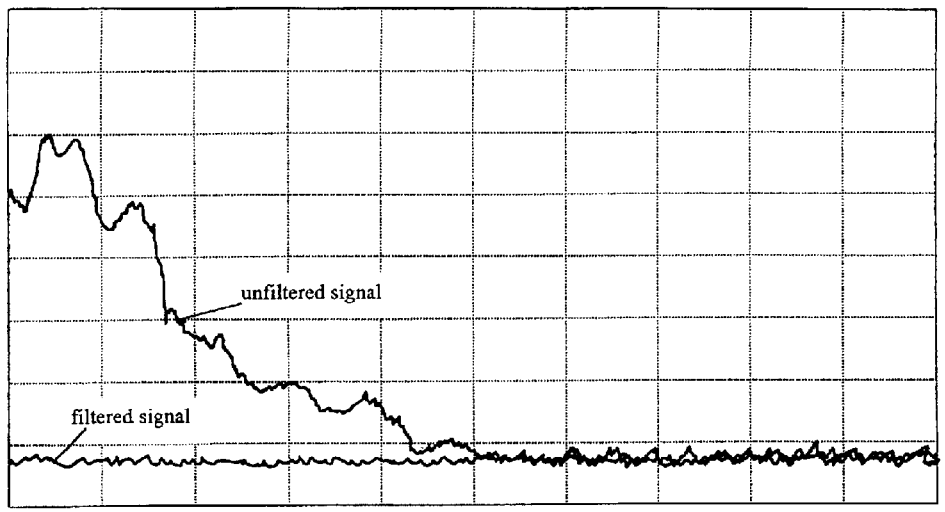
FIG. 4 is a frequency spectrum plot comparing components of a drive signal in filtered and unfiltered states as observed with a motor winding connected as the test object.

The effects of sensors applied for testing of various commercially available motors are illustrated in FIGS. 4 and 5, and FIGS. 6 and 7. FIG. 4 shows the frequency spectrum of a variable speed drive signal such as would be applied to the coil of a General Electric GEB13 motor. The unfiltered drive signal shows harmonic content up to 20 with strong signal contributions in the range from 1 to 5 MHz. FIG. 4 further shows the frequency spectrum of the drive signal after being filtered through a sensor with a 17 MHz cut-off frequency after discharge inception.

Figure 5:
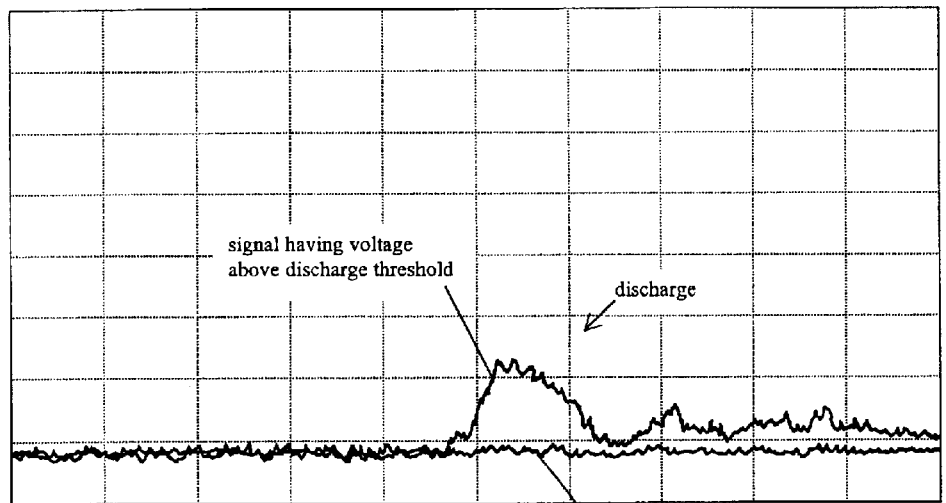
FIG. 5 is a frequency spectrum plot showing components of a discharge signal detected in the drive signal of FIG. 4 when applied to a motor winding.

FIG. 5 shows the filtered drive signal applied to the motor coil with a voltage below the discharge threshold, and the filtered signal obtained when the drive waveform of FIG. 4 is applied to the drive the motor coil with a voltage above the discharge threshold. The discharge signal components are easily discernable in the latter signal.

Figure 6:
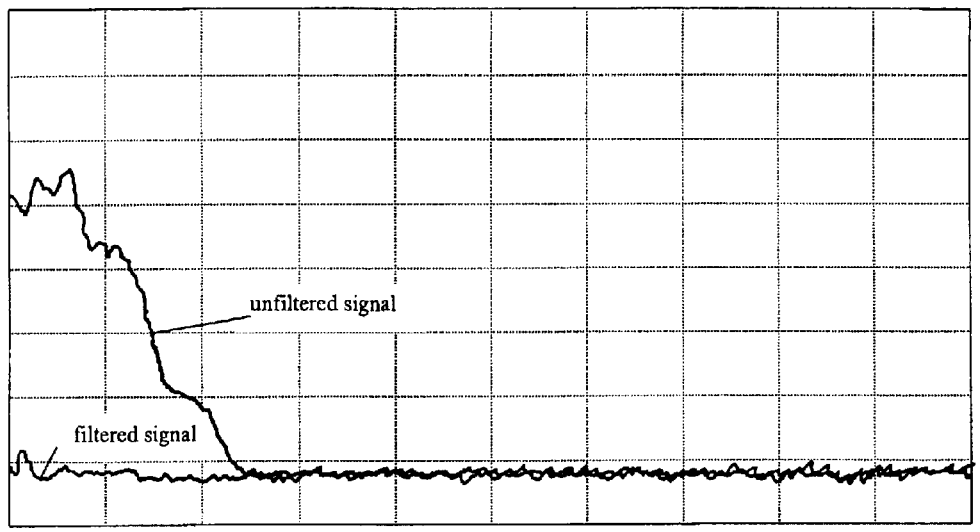
FIG. 6 is a frequency spectrum plot comparing components of a second drive signal in filtered and unfiltered states as observed with a motor winding connected as the test object.
Figure 7:
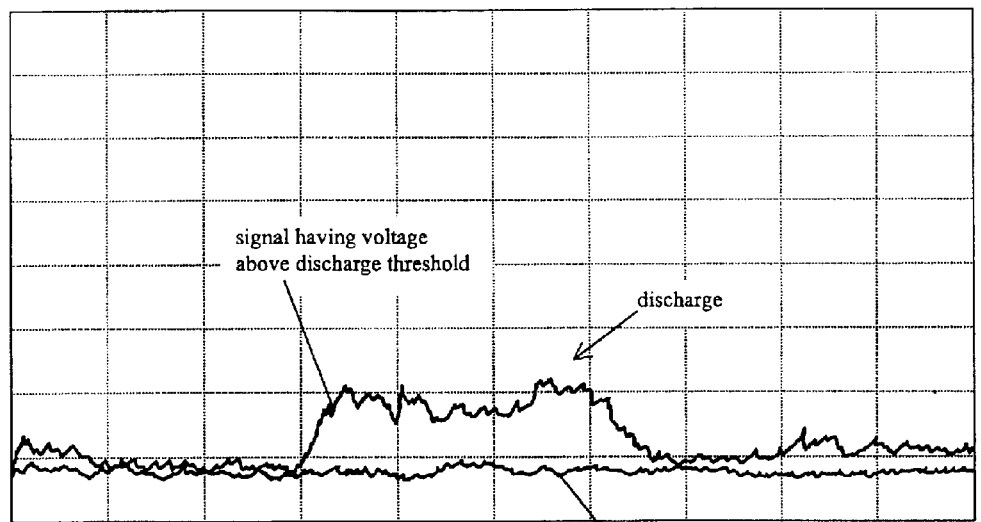
FIG. 7 is a frequency spectrum plot showing components of a discharge signal detected in the drive signal of FIG. 6 when applied to the motor winding.

FIG. 6 shows filtered and unfiltered frequency spectra of the signal as would be applied at the drive input of a General Electric 30 horsepower, 460 Volt, random wound motor driven with a variable speed drive signal. FIG. 7 shows the filtered signal applied to the motor at voltages below and above the discharge threshold. Again it is readily seen that the discharge components are clearly discernable in the filtered signal above the discharge threshold.

While the embodiments described above employ high pass filters in the sensor, it is noted that in some situations it may be useful to use band-pass or band-reject filters, or combinations thereof. Filters having eight or more poles are preferably employed.

Figure 8:
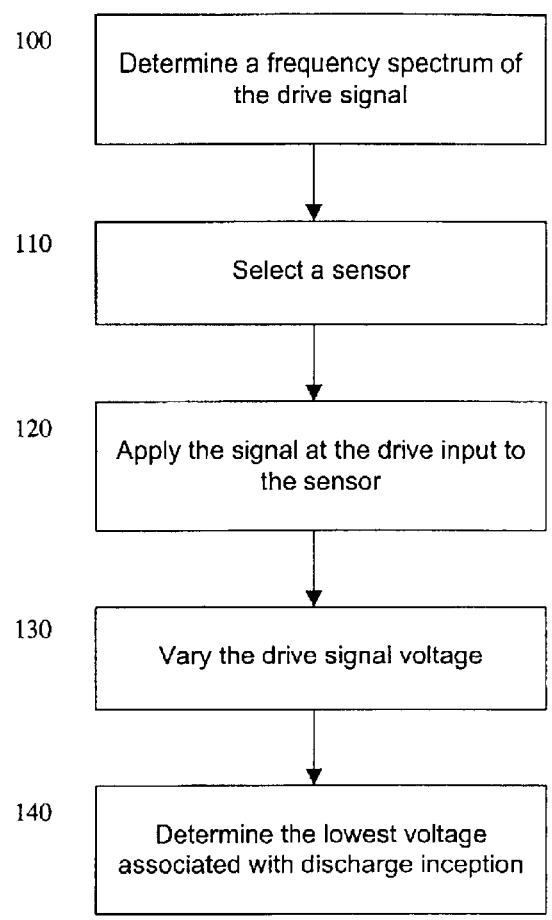
FIG. 8 illustrates a process flow diagram for evaluating insulation defects in a variable speed motor.

The use of filters as described above may be applied in embodiments of the invention to evaluate insulation defects in a variable speed motor. A process in accordance with such embodiments of the invention is illustrated in FIG. 8. Initially, a frequency spectrum of the drive signal applied to a variable speed motor is determined 100. The signal may be a single pulse, or an approximated sinusoidal waveform. Where a waveform is applied, the particular waveform depends on the particular type of motor to which it is applied, and therefore the frequency spectrum that is encountered in a particular case depends on the motor being tested. Determining the frequency spectrum may be done manually using a spectrum analyzer. It is noted that the signal may be tuned to minimize the high frequency harmonics. After the frequency spectrum has been determined, a sensor is selected 110. Selection of the sensor involves determination of the transfer function that is necessary to suppress high frequency components of the drive signal to a level below the discharge signal detection threshold, as described above. Once a sensor is selected, the signal at the drive signal input of the motor winding is applied 120 to the sensor. As noted above, the signal applied to the sensor includes both drive signal components and discharge signal components. The drive signal voltage is then varied 130, and a lowest voltage associated with inception of a discharge is determined 140. In other words, as the voltage is varied, for example by beginning at a low voltage and raising the voltage, the filter output is monitored for discharge signals, so that a lowest drive signal voltage producing a discharge can be identified, for example, the voltage at which the first discharge is produced as the voltage is raised. This lowest voltage is the corona inception voltage. It may be further desirable to determine the magnitude of the discharge at the corona inception voltage, which may be accomplished by observation of the discharge components in the output of the filter at the corona inception voltage, or to determine the drive signal polarity at inception.

In alternative embodiments of the invention, a fast rise time wave may be applied to an insulated coil, and the voltage of the wave may be varied to detect a corona inception voltage. An appropriate wave generator can be generated by a surge tester such as Baker Instruments model D12000. Such alternative embodiments are suitable for off line evaluation of motor coils such as would be practiced for quality assurance and control testing.

The above process steps may be manually performed, for example by observing the frequency spectrum of a drive signal on a spectrum analyzer, manually selecting a filter circuit, connecting the filter circuit so that the signal is applied to the filter, manually varying the voltage of the drive signal by means of controls of the drive signal pulse generator, and observing the filter output on an oscilloscope to detect discharge. However, automated embodiments of the process are also contemplated, for example, a process enabled by a control system that controls drive signal voltage, monitors drive signal spectrum and filter output spectrum, and selects and applies a filter having an appropriate transfer function.

Figure 9:
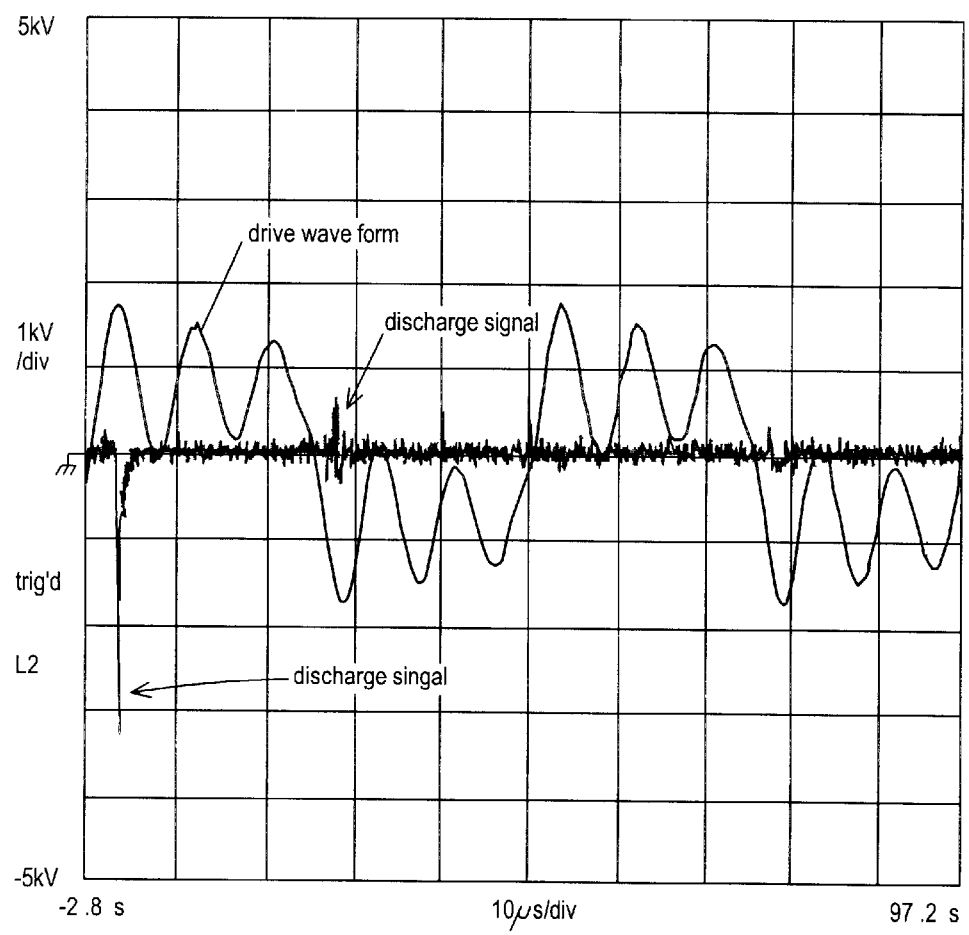
FIGS. 9 and 10 are time domain plots showing phase-resolved detection of discharge inception.
Figure 10:
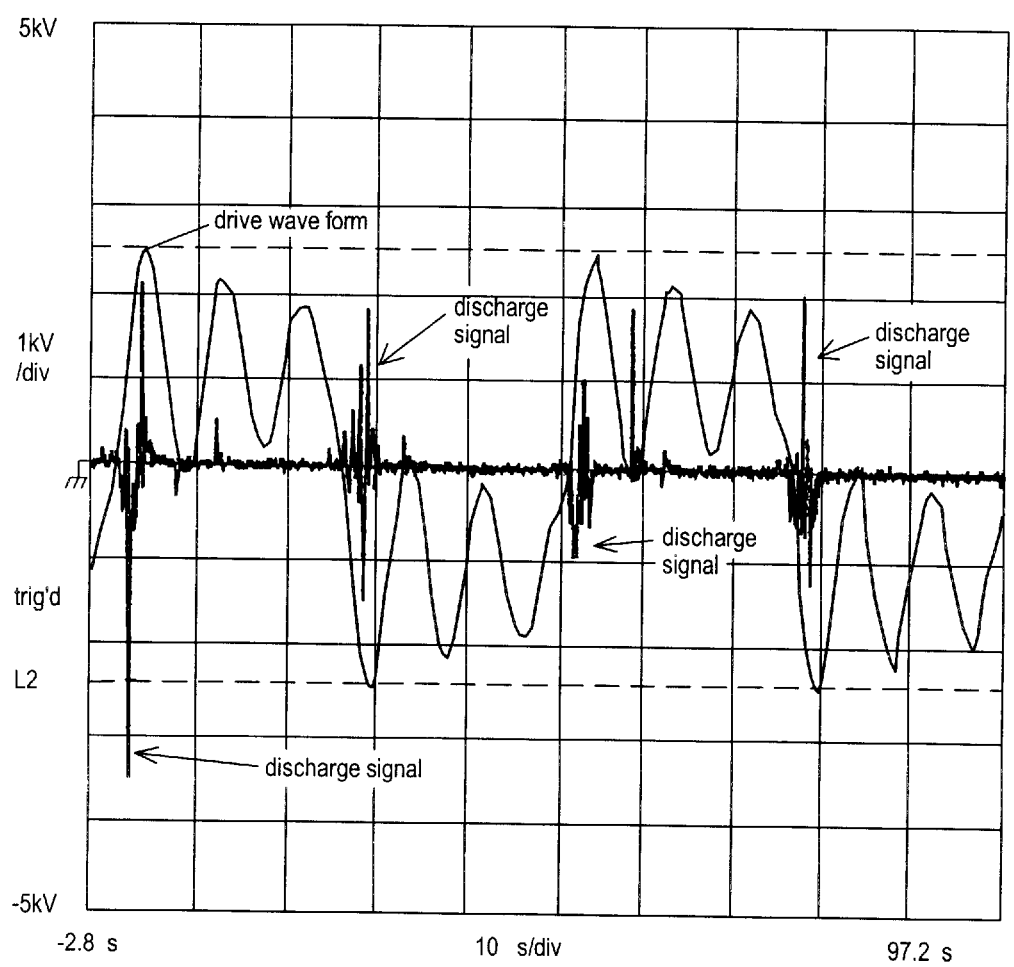

FIGS. 9 and 10 illustrate exemplary time-based data showing a drive waveform and discharge signals produced in response to the drive waveform, which occur at drive waveform maxima. FIG. 9 shows discharge activity in response to a drive waveform that is just above discharge inception voltage, while FIG. 10 shows discharge activity in response to a drive waveform that is well above the discharge inception voltage. Comparison of the FIGS. shows the greater discharge activity is produced at higher drive voltages, and that discharge is statistically most likely to occur at drive signal maxima, although the discharge amplitude may vary with signal polarity.

The signals from the filters can be used to enable simple QA or QC purposes, depending upon the manufacturing needs. On-line or off-line testing of units in the field can also be enabled by this technology.

While the embodiments described above are the embodiments presently preferred by the inventors, a variety of alternative implementations may be employed without departing from the scope of the claimed invention.

What is claimed is:

1. A method for evaluating insulation defects in a variable speed motor, comprising:

determining a frequency spectrum of a drive signal applied to a variable speed motor;

selecting a sensor having a transfer function characterized by a cutoff at a frequency within an overlap of the frequency spectrum of the drive signal and a frequency spectrum of a discharge event, and having a rejection for reducing components of said drive signal to below a predetermined detection threshold for a discharge event;

applying to the sensor a signal S obtained from a drive input of said motor receiving said drive signal;

varying the voltage of the drive signal applied to said motor;

determining a lowest voltage of the drive signal associated with inception of a discharge event represented in output of the sensor; and analyzing said frequency spectrum to determine a magnitude of inception of the discharge event.

2. The method claimed in claim 1, further comprising determining a polarity of the drive signal associated with inception of a discharge event.

3. The method claimed in claim 1, further comprising determining a magnitude of a detected discharge event.

4. The method claimed in claim 1, wherein said sensor has a cutoff frequency in a range of approximately 5 MHz to 20 MHz, and a rejection of at least 60 dB within one decade from the cutoff frequency.

5. The method claimed in claim 1, wherein varying the voltage of the drive signal comprises raising the voltage of the drive signal, and wherein determining a lowest voltage comprises determining a voltage associated with a first detection of a discharge event.

6. The method claimed in claim 1, wherein said drive signal is comprised of one of a single pulse and a series of pulses that approximates a sinusoidal waveform.

7. The method claimed in claim 1, wherein the signal S is obtained from a drive input of the motor by a high frequency current transformer of the sensor.

8. A system for on line analysis of a variable speed motor comprising:

a sensor receiving a signal obtained from a drive signal input of a variable speed motor driven by a pulse drive signal, the sensor having a transfer function for rejecting components in a frequency band of the drive signal that overlaps a frequency band of a signal produced by a discharge event, and for passing components of a signal produced by a discharge event;

a detector receiving output of the sensor for detecting components of a signal produced by a discharge event; and an analyzer for determining a voltage of the drive signal at inception of a detected discharge event.

9. The system claimed in claim 8, the analyzer further determining a polarity of the drive signal associated with inception of a discharge event.

10. The system claimed in claim 8, the analyzer further determining a magnitude of a detected discharge event.

11. The system claimed in claim 8, wherein the sensor has a cutoff frequency in a range of approximately 5 MHz to 20 MHz, and a rejection of at least 60 dB within one decade from the cutoff frequency.

12. The system claimed in claim 8, wherein the sensor comprises a high frequency current transformer coupled to the drive signal input of the variable speed motor.

13. The system claimed in claim 8, wherein the drive signal is variable in voltage.

14. The system claimed in claim 13, further comprising means for varying the voltage of the drive signal.

15. The system claimed in claim 8, wherein said drive signal is comprised of a series of square pulses that approximate a sinusoidal waveform.

16. An apparatus for determining the corona inception voltage of an insulated winding, comprising:

a transformer coupling a signal from an input of a winding driven by a high voltage drive signal comprised of a series of square pulses that approximate a sinusoidal waveform;

a filter, the transformer and the filter operating together to reject components of the signal passed by the means for coupling such that components of the signal that overlap components of signals produced by discharge events are suppressed to below a detection threshold of said components of signals produced by said discharge events; and means for analyzing an output frequency spectrum of the filter indicative of a discharge event detected in said output frequency spectrum.

17. The apparatus claimed in claim 16, wherein the transformer and filter provide a cutoff frequency in a range of approximately 5 MHz to 20 MHz, and a rejection of at least 60 dB within one decade from the cutoff frequency.

18. The apparatus claimed in claim 16, wherein the filter comprises a high pass filter having eight or more poles.

* * * * *